US012710476B2

(12) United States Patent
Lee

(10) Patent No.: US 12,710,476 B2
(45) Date of Patent: Aug. 18, 2026

(54) BATTERY DIAGNOSIS DEVICE, BATTERY PACK, BATTERY SYSTEM, AND BATTERY DIAGNOSIS METHOD

(71) Applicant: LG ENERGY SOLUTION, LTD., Seoul (KR)

(72) Inventor: Hyun-Jun Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 708 days.

(21) Appl. No.: 17/925,218

(22) PCT Filed: Aug. 3, 2021

(86) PCT No.: PCT/KR2021/010181
§ 371 (c)(1),
(2) Date: Nov. 14, 2022

(87) PCT Pub. No.: WO2022/030971
PCT Pub. Date: Feb. 10, 2022

(65) Prior Publication Data

US 2023/0184837 A1 Jun. 15, 2023

(30) Foreign Application Priority Data

Aug. 3, 2020 (KR) ........................ 10-2020-0096786

(51) Int. Cl.
*G01R 31/367* (2019.01)
*G01R 31/36* (2020.01)
*G01R 31/3835* (2019.01)

(52) U.S. Cl.
CPC ....... *G01R 31/367* (2019.01); *G01R 31/3648* (2013.01); *G01R 31/3835* (2019.01)

(58) Field of Classification Search
None
See application file for complete search history.

(56) References Cited

U.S. PATENT DOCUMENTS 10,371,754 B2 * 8/2019 Guo ........................ B60L 58/12
2004/0042150 A1 * 3/2004 Swinbanks ............ F16F 15/03 348/E9.023

(Continued)

FOREIGN PATENT DOCUMENTS

CN 109765490 A 5/2019
CN 110794305 A 2/2020

(Continued)

OTHER PUBLICATIONS

Linear parameter varying battery model identification using subspace methods, Y. Hu (Year: 2011).*

(Continued)

*Primary Examiner* — Shelby A Turner
*Assistant Examiner* — Brandon J Becker
(74) *Attorney, Agent, or Firm* — Birch, Stewart, Kolasch & Birch, LLP

(57) ABSTRACT

A battery diagnosis device according includes a memory configured to store an observation matrix including a plurality of observation voltage vectors indicating a time-series of cell voltage of each of battery cells, and a controller configured to determine a plurality of principal component vectors, a plurality of singular values and a plurality of coefficient vectors from the observation matrix. Each coefficient vector includes a plurality of coefficients corresponding to the plurality of observation voltage vectors in a one-to-one relationship. The controller, for each coefficient vector, determines an invalid coefficient among the plurality of coefficients by comparing the plurality of coefficients included in the corresponding coefficient vector, and detects abnormality of the battery cell corresponding to the invalid coefficient based on the principal component vector corresponding to the corresponding coefficient vector, the singu- (Continued)

lar value corresponding to the corresponding coefficient vector and the invalid coefficient.

20 Claims, 7 Drawing Sheets

(56) References Cited

U.S. PATENT DOCUMENTS

| | | | | |
|---|---|---|---|---|
| 2004/0100227 | A1* | 5/2004 | Yumoto | G01R 31/3648 320/151 |
| 2005/0090755 | A1 | 4/2005 | Guion et al. | |
| 2005/0194976 | A1* | 9/2005 | Yumoto | G01R 31/367 324/433 |
| 2005/0264296 | A1* | 12/2005 | Philbrook | G01R 31/385 324/433 |
| 2009/0198399 | A1* | 8/2009 | Kubo | H02J 7/00309 701/22 |
| 2010/0261043 | A1* | 10/2010 | Kim | H01M 10/4207 429/61 |
| 2010/0261048 | A1* | 10/2010 | Kim | H01M 10/441 429/150 |
| 2012/0025769 | A1* | 2/2012 | Kikuchi | B60L 58/14 320/118 |
| 2014/0361908 | A1* | 12/2014 | Laird | G01F 15/061 73/861.77 |
| 2016/0018472 | A1* | 1/2016 | Sung | G01R 31/367 702/63 |
| 2016/0239759 | A1 | 8/2016 | Sung | |
| 2017/0126027 | A1 | 5/2017 | Park | |
| 2020/0081066 | A1 | 3/2020 | Ahn | |
| 2020/0096572 | A1 | 3/2020 | You et al. | |
| 2020/0355749 | A1 | 11/2020 | Takahashi et al. | |

FOREIGN PATENT DOCUMENTS

| | | | |
|---|---|---|---|
| CN | 110907833 | A | 3/2020 |
| JP | 2019-20174 | A | 2/2019 |
| JP | 2020-9646 | A | 1/2020 |
| JP | WO2019/138286 | A1 | 2/2021 |
| KR | 10-0805181 | B1 | 2/2008 |
| KR | 10-2016-0010132 | A | 1/2016 |
| KR | 10-2016-0101506 | A | 8/2016 |
| KR | 10-2017-0051059 | A | 5/2017 |
| KR | 10-2019-0095754 | A | 8/2019 |
| KR | 10-2020-0033554 | A | 3/2020 |

OTHER PUBLICATIONS

Reliable Online Parameter Identification of Li-Ion Batteries in Battery Management Systems Using the Condition Number of the Error Covariance Matrix, Minho Kim (Year: 2020).*

International Search Report for PCT/KR2021/010181 (PCT/ISA/210) mailed on Nov. 25, 2021.

* cited by examiner

FIG. 6

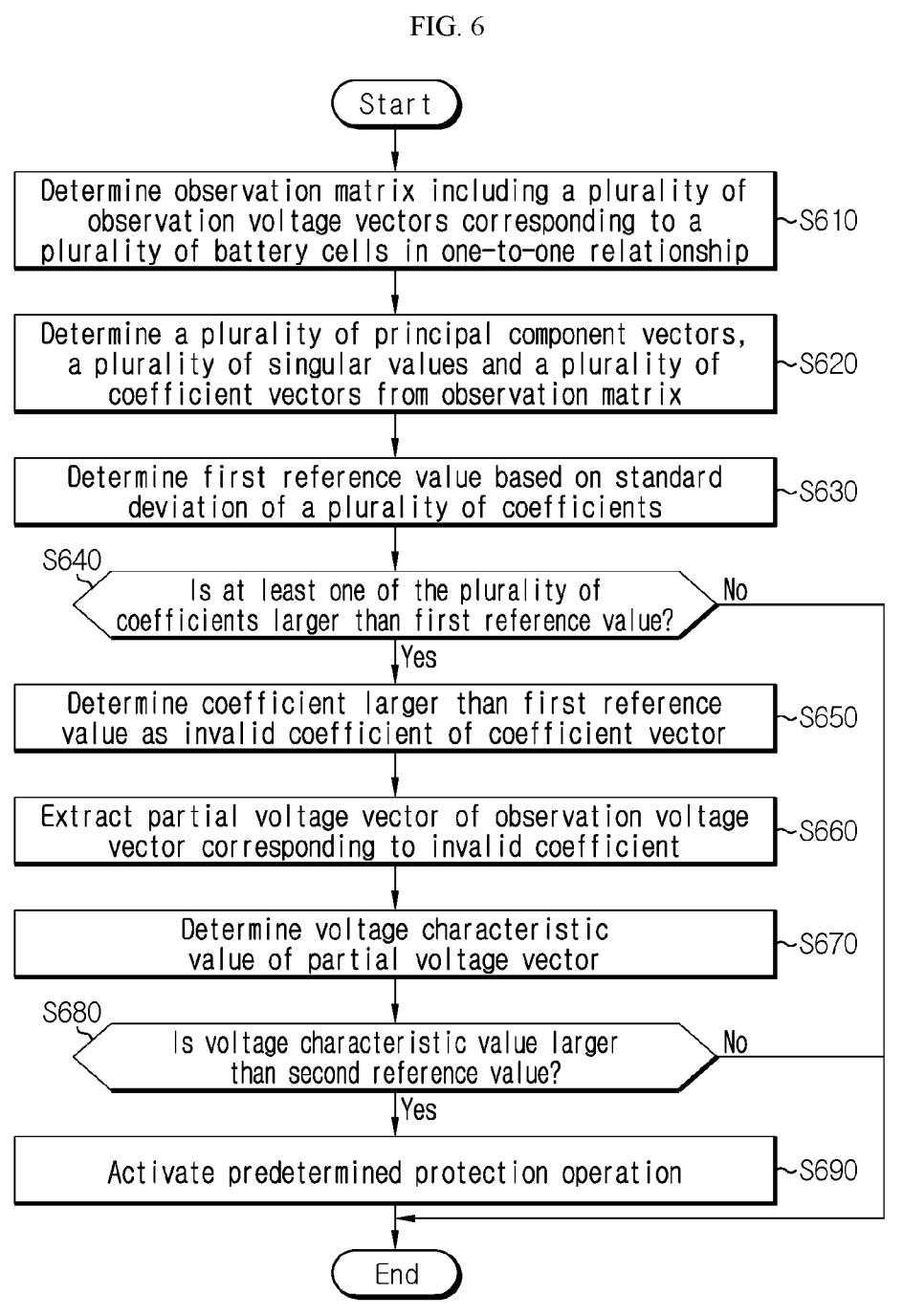

Start

Determine observation matrix including a plurality of observation voltage vectors corresponding to a plurality of battery cells in one-to-one relationship ~S610

Determine a plurality of principal component vectors, a plurality of singular values and a plurality of coefficient vectors from observation matrix ~S620

Determine first reference value based on standard deviation of a plurality of coefficients ~S630

S640 Is at least one of the plurality of coefficients larger than first reference value? (Yes / No)

Determine coefficient larger than first reference value as invalid coefficient of coefficient vector ~S650

Extract partial voltage vector of observation voltage vector corresponding to invalid coefficient ~S660

Determine voltage characteristic value of partial voltage vector ~S670

S680 Is voltage characteristic value larger than second reference value? (Yes / No)

Activate predetermined protection operation ~S690

End

BATTERY DIAGNOSIS DEVICE, BATTERY PACK, BATTERY SYSTEM, AND BATTERY DIAGNOSIS METHOD

TECHNICAL FIELD

The present disclosure relates to technology for battery cell abnormality detection. The present application claims the benefit of Korean Patent Application No. 10-2020-0096786 filed on Aug. 3, 2020 with the Korean Intellectual Property Office, the disclosure of which is incorporated herein by reference in its entirety.

BACKGROUND ART

Recently, there has been a rapid increase in the demand for portable electronic products such as laptop computers, video cameras and mobile phones, and with the extensive development of electric vehicles, accumulators for energy storage, robots and satellites, many studies are being made on high performance batteries that can be repeatedly recharged.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

Recently, with the widespread of applications requiring high voltage, a battery pack including a plurality of battery cells connected in series is being widely used. As the number of battery cells included in the battery pack increases, there is an increasing likelihood that an abnormality of the battery cell occurs. Accordingly, there is an increasing need for diagnosis technology for accurately detecting an abnormality of the battery cell.

The related art monitors cell information (for example, voltage, current, temperature) including a plurality of parameters associated with a state of the battery cell, and detects an abnormality of the battery cell based on the operational state (for example, charge, discharge, rest) of the battery cell and the monitored cell information.

However, the above-described abnormality detection method requires a battery management system (BMS) to monitor the cell information of the battery cell using many sensors, so abnormality detection requires a large amount of computation and a long time. In particular, under the structure in which the power of the BMS is supplied from the battery cell, the electrical energy of the battery cell may be consumed all the time during the operation of the BMS for abnormality detection.

Moreover, the related art detects abnormality of the battery cell based on the rapid changes in the cell information of the battery cell in a short time. However, in some instances, the cell information of the faulty battery cell does not always rapidly change in a short time, and may tend to slowly change over a long period of time, failing to detect an abnormality of the battery cell at a proper time.

DISCLOSURE

Technical Problem

The present disclosure is designed to solve the above-described problem, and therefore the present disclosure is directed to providing a battery diagnosis device, a battery pack, a battery system and a battery diagnosis method using a cell voltage of each of a plurality of battery cells connected in series as a single parameter for abnormality detection.

The present disclosure is further directed to providing a battery diagnosis device, a battery pack, a battery system and a battery diagnosis method for battery cell abnormality detection, in which an observation matrix is generated, the observation matrix being a dataset including a plurality of observation voltage vectors indicating a voltage history (time-series) of a cell voltage of each of a plurality of battery cells observed during the same period, and an abnormal behavior of the cell voltage of each battery cell is identified based on a result of analyzing the observation matrix.

These and other objects and advantages of the present disclosure may be understood by the following description and will be apparent from the embodiments of the present disclosure. In addition, it will be readily understood that the objects and advantages of the present disclosure may be realized by the means set forth in the appended claims and a combination thereof.

Technical Solution

A battery diagnosis device according to an aspect of the present disclosure includes a memory configured to store an observation matrix including a plurality of observation voltage vectors indicating a time-series of cell voltage of each of a plurality of battery cells, and a controller configured to determine a plurality of principal component vectors, a plurality of singular values and a plurality of coefficient vectors from the observation matrix. Each coefficient vector includes a plurality of coefficients corresponding to the plurality of observation voltage vectors in a one-to-one relationship. The controller is configured to, for each coefficient vector, determine an invalid coefficient among the plurality of coefficients by comparing the plurality of coefficients included in the corresponding coefficient vector, and detect abnormality of the battery cell corresponding to the invalid coefficient among the plurality of battery cells based on the principal component vector corresponding to the corresponding coefficient vector among the plurality of principal component vectors, the singular value corresponding to the corresponding coefficient vector among the plurality of singular values and the invalid coefficient.

The controller may be further configured to determine a first sub-matrix, a second sub-matrix and a third sub-matrix by applying a matrix decomposition algorithm to the observation matrix. The first sub-matrix includes the plurality of principal component vectors as column vectors. The second sub-matrix includes the plurality of singular values as elements of a principal diagonal. The third sub-matrix includes the plurality of coefficient vectors as row vectors.

The controller may be further configured to determine, as the invalid coefficient, the coefficient of which an absolute value of a difference between the coefficient and an average of the plurality of coefficients among the plurality of coefficients is larger than a first reference value.

The controller may be further configured to determine the first reference value to be equal to a value obtained by multiplying a standard deviation of the plurality of coefficients by a first scaling factor.

The controller may be further configured to, for each coefficient vector, extract a partial voltage vector of the observation voltage vector corresponding to the invalid coefficient among the plurality of observation voltage vectors by multiplying the principal component vector corresponding to the corresponding coefficient vector among the plurality of principal component vectors, the singular value corresponding to the corresponding coefficient vector among the plurality of singular values and the invalid coefficient, and detect the battery cell corresponding to the invalid coefficient among the plurality of battery cells as faulty when a voltage characteristic value of the partial voltage vector is larger than a second reference value.

The controller may be further configured to determine the voltage characteristic value to be equal to a difference between a maximum partial voltage and a minimum partial voltage among a plurality of partial voltages included in the partial voltage vector.

The controller may be further configured to determine the second reference value to be equal to a value obtained by multiplying a voltage resolution of a voltage measurement circuit by a second scaling factor.

The controller may be further configured to output a fault message when a ratio of a maximum singular value to a minimum singular value among the plurality of singular values is less than a preset value.

A battery pack according to another aspect of the present disclosure includes the battery diagnosis device.

A battery system according to still another aspect of the present disclosure includes the battery pack.

A battery diagnosis method according to yet another aspect of the present disclosure includes determining a plurality of principal component vectors, a plurality of singular values and a plurality of coefficient vectors from an observation matrix including a plurality of observation voltage vectors indicating a time series of cell voltage of each of a plurality of battery cells. Each coefficient vector includes a plurality of coefficients corresponding to the plurality of observation voltage vectors in a one-to-one relationship. The battery diagnosis method further includes, for each coefficient vector, determining an invalid coefficient among the plurality of coefficients by comparing the plurality of coefficients included in the corresponding coefficient vector, and detecting abnormality of the battery cell corresponding to the invalid coefficient among the plurality of battery cells based on the principal component vector corresponding to the corresponding coefficient vector among the plurality of principal component vectors, the singular value corresponding to the corresponding coefficient vector among the plurality of singular values and the invalid coefficient.

Determining the invalid coefficient among the plurality of coefficients may include determining, as the invalid coefficient, the coefficient of which an absolute value of a difference between the coefficient and an average of the plurality of coefficients among the plurality of coefficients is larger than a first reference value.

Detecting abnormality of the battery cell corresponding to the invalid coefficient among the plurality of battery cells may include extracting a partial voltage vector of the observation voltage vector corresponding to the invalid coefficient among the plurality of observation voltage vectors by multiplying the principal component vector corresponding to the corresponding coefficient vector among the plurality of principal component vectors, the singular value corresponding to the corresponding coefficient vector among the plurality of singular values and the invalid coefficient, and detecting the battery cell corresponding to the invalid coefficient among the plurality of battery cells as faulty when a voltage characteristic value of the partial voltage vector is larger than a second reference value.

Advantageous Effects

According to at least one of the embodiments of the present disclosure, it is possible to reduce the computational amount, time and power required for abnormality detection by using only the cell voltage except the current or temperature to detect abnormality of each of a plurality of battery cells connected in series.

In addition, according to at least one of the embodiments of the present disclosure, it is possible to improve the accuracy of battery cell abnormality detection by generating an observation matrix which is a dataset including a plurality of observation voltage vectors indicating a voltage history (time-series) of a cell voltage of each of a plurality of battery cells observed for the same period of time, and identifying an abnormal behavior of the cell voltage of each battery cell based on a result of analyzing the observation matrix.

The effects of the present disclosure are not limited to the effects mentioned above, and these and other effects will be clearly understood by those skilled in the art from the appended claims.

DESCRIPTION OF DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

FIG. 6 is a flowchart exemplarily showing a battery diagnosis method according to a first embodiment of the present disclosure.

BEST MODE

Figure 1:
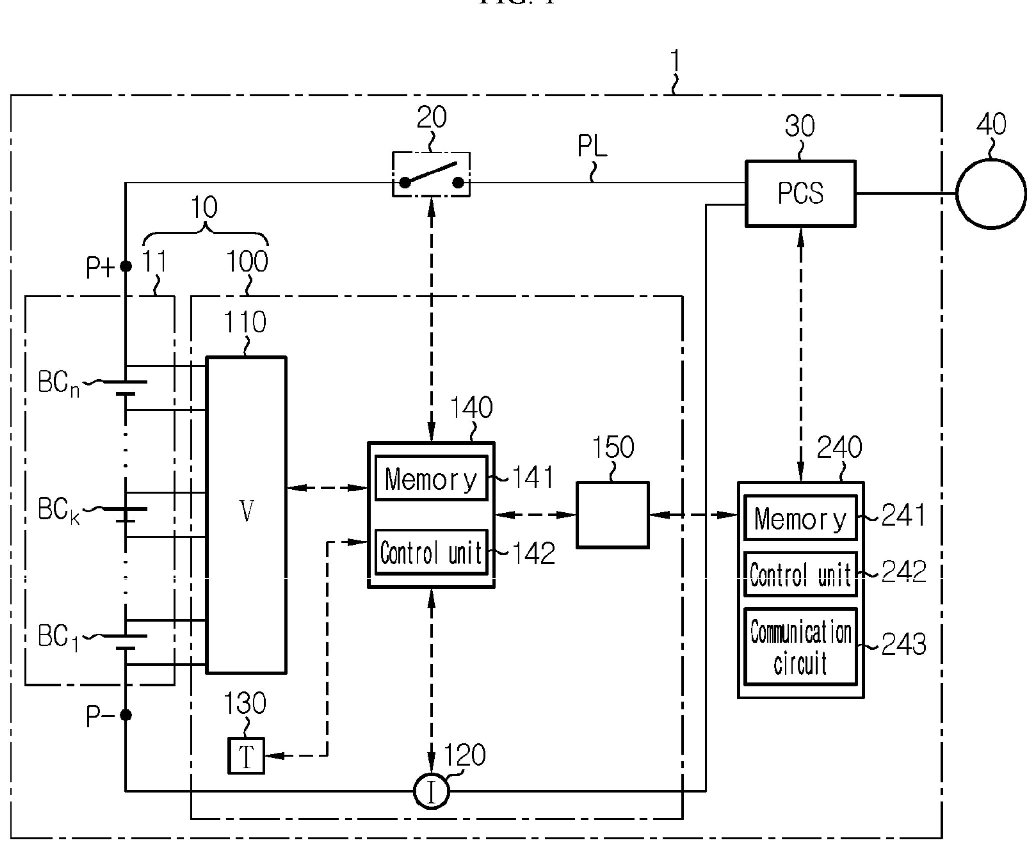
FIG. 1 is a diagram exemplarily showing a configuration of a battery system according to the present disclosure.

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term "control unit" as used herein refers to a processing unit of at least one function or operation, and this may be implemented by hardware and software either alone or in combination.

In addition, throughout the specification, it will be further understood that when an element is referred to as being "connected to" another element, it can be directly connected to the other element or intervening elements may be present.

FIG. 1 is a diagram exemplarily showing a configuration of a battery system according to the present disclosure.

FIG. 1 shows an energy storage system as an example of the battery system 1. Referring to FIG. 1, the battery system 1 includes a battery pack 10 and a switch 20. The battery system 1 may further include at least one of a remote controller 240 or a power conversion system 30. The battery system 1 is not limited to the energy storage system, and may include any battery system having a charging function and/or a discharging function of the battery pack 10 provided therein, such as an electric vehicle or a battery tester.

The battery pack 10 includes a positive terminal P+, a negative terminal P−, a cell group 11 and a battery management system 100. The cell group 11 includes a plurality of battery cells $BC_1$~$BC_n$ (n is a natural number of 2 or greater) electrically connected between the positive terminal P+ and the negative terminal P−. FIG. 1 shows the plurality of battery cells $BC_1$~$BC_n$ connected in series within the cell group 11. Hereinafter, in providing the description in common to the plurality of battery cells $BC_1$~$BC_n$, the reference sign 'BC' is used to refer to the battery cell.

The positive terminal and the negative terminal of the battery cell BC are electrically coupled to other battery cell BC through a conductor such as a busbar. The battery cell BC may be a lithium ion battery cell. The battery cell BC is not limited to a particular type, and may include any type of battery cell that can be repeatedly recharged.

The switch 20 is installed on a power line PL for the battery pack 10. While the switch 20 is on, power transfer from any one of the battery pack 10 or the power conversion system 30 to the other is possible. The switch 20 may be implemented as at least one of well-known switching devices such as a relay and a Field Effect Transistor (FET).

The power conversion system 30 is operably coupled to at least one of the battery management system 100 or the remote controller 240. Operably coupled refers to directly/indirectly connected to transmit and receive a signal in one or two directions. The power conversion system 30 may produce the direct current power for the charge of the cell group 11 from the alternating current power supplied by an electrical grid 40. The power conversion system 30 may produce the alternating current power from the direct current power from the battery pack 10.

The battery management system 100 may include a voltage measurement circuit 110 and a battery controller 140. The battery management system 100 may further include at least one of a current sensor 120, a temperature sensor 130 or an interface unit 150. The interface unit 150 may be included in the battery controller 140.

The voltage measurement circuit 110 is provided to be electrically connectable to the positive terminal and the negative terminal of the battery cell BC. The voltage measurement circuit 110 may measure a cell voltage or a voltage across the battery cell BC, and output a signal indicating the measured cell voltage to the battery controller 140.

The current sensor 120 is electrically connected in series to the cell group 11 through the power line PL. For example, a shunt resistor or a hall effect device may be used as the current sensor 120. The current sensor 120 may measure a current flowing through the cell group 11, and output a signal indicating the measured current to the battery controller 140.

The temperature sensor 130 is disposed within a predetermined distance range from the cell group 11. For example, a thermocouple may be used as the temperature sensor 130. The temperature sensor 130 may measure a temperature of the cell group 11, and output a signal indicating the measured temperature to the battery controller 140.

The battery controller 140 is operably coupled to the voltage measurement circuit 110, the current sensor 120, the temperature sensor 130 and/or the interface unit 150. At least one of the battery controller 140 or the remote controller 240 may control the on/off of the switch 20 according to the result of diagnosis for the cell group 11.

The interface unit 150 may be coupled to the remote controller 240 of the battery system 1 to enable communication. The interface unit 150 may transmit a signal from the remote controller 240 to the battery controller 140, and a signal from the battery controller 140 to the remote controller 240. The signal from the battery controller 140 may include information for notifying abnormality of the battery cell BC. The communication between the interface unit 150 and the remote controller 240 may use, for example, a wired network such as a local area network (LAN), a controller area network (CAN) and a daisy chain and/or a wireless network such as Bluetooth, Zigbee and Wi-Fi. The interface unit 150 may include an output device (for example, a display, a speaker) to provide the information received from the battery controller 140 and/or the remote controller 240 in a recognizable format. The remote controller 240 may control at least one of the battery pack 10, the switch 20 or the power conversion system 30 based on cell information (for example, cell voltage, current, temperature, SOC, abnormality of the battery cell BC) collected through communication with the battery management system 100.

The battery controller 140 includes a memory 141 and a control unit 142. The remote controller 240 may include a memory 241 and a control unit 242. The remote controller 240 may further include a communication circuit 243. The remote controller 240 may be implemented in the form of a cloud server or a mobile diagnosis device. The communication circuit 243 is for wired/wireless communication with the battery management system 100.

Each of the control unit 142 and the control unit 242 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors or electrical units for performing the other functions.

At least one of the memory 141 or the memory 142 may pre-store programs and data necessary to perform battery diagnosis methods (diagnosis procedures) according to embodiments as described below. Each of the memory 141 and the memory 142 may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM). At least one of the memory 141 or the memory 142 may record data and algorithms required to detect abnormality of the battery BC by performing the following diagnosis procedures (FIGS. 2 to 6). The memory 141 and the control unit 142 may be integrated into a single chip. The memory 241 and the control unit 242 may be integrated into a single chip.

The battery controller 140 is an example of a battery diagnosis device according to the present disclosure, and the remote controller 240 is another example of a battery diagnosis device according to the present disclosure. That is, the diagnosis procedures described below with reference to FIGS. 2 to 7 are performed by at least one of the battery controller 140 or the remote controller 240 provided as a battery diagnosis device.

The battery diagnosis device according to the present disclosure may perform the diagnosis procedures (see FIGS. 6 and 7) for detecting abnormality of the plurality of battery cells $BC_1$~$BC_n$. The diagnosis procedures may be based on voltage data (see $X_1$~$X_n$ in FIG. 2) acquired for a specified period (for example, a predetermined time in the past) during which the cell group 11 is kept in a predetermined diagnosis possible state (for example, rest, constant current charge, constant voltage charge, constant current discharge). The following description will be made under the assumption that the battery controller 140 is provided as a battery diagnosis device.

Figure 2:
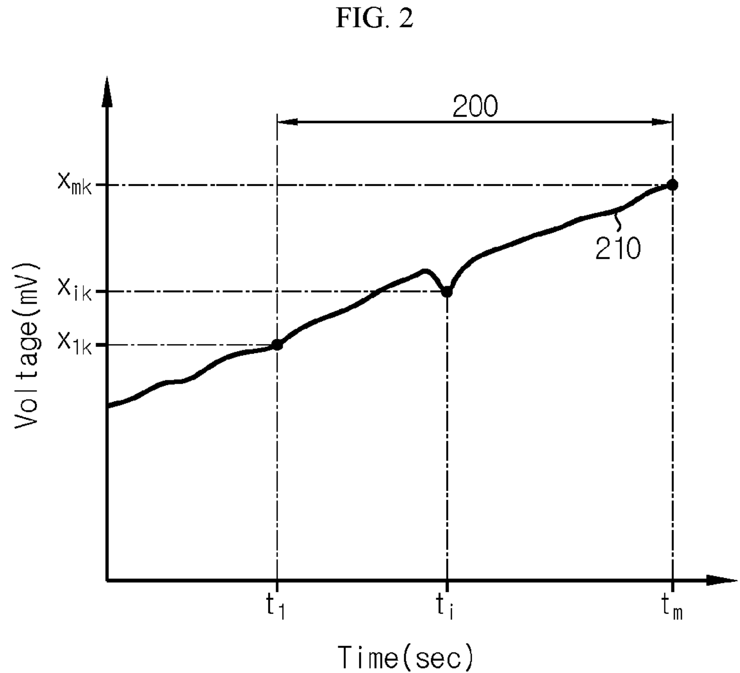
FIG. 2 is a graph exemplarily showing a change in cell voltage of a battery cell over time.
Figure 3:
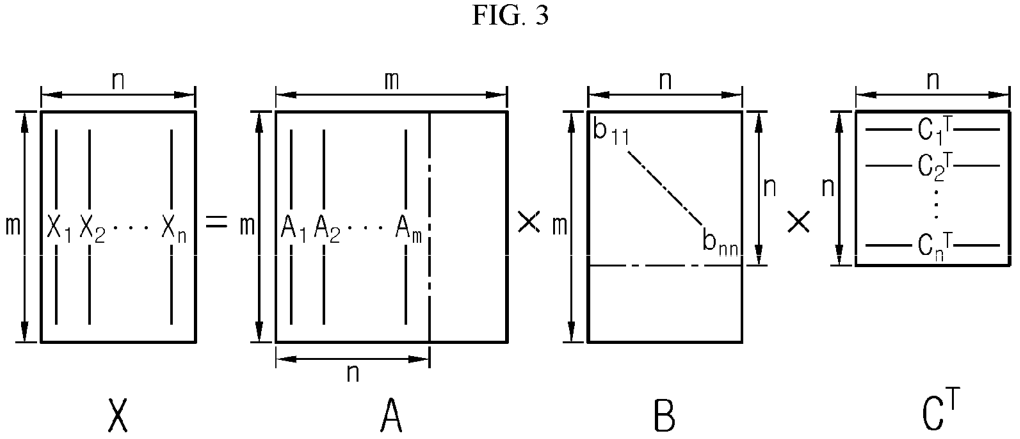
FIG. 3 is a diagram referenced in describing an exemplary observation matrix as a dataset indicating a voltage history of the battery cell shown in FIG. 2.

FIG. 2 is a graph exemplarily showing a change in cell voltage of the battery cell over time, and FIG. 3 is a diagram referenced in describing an exemplary observation matrix as a dataset indicating a voltage history of the battery cell shown in FIG. 2.

The control unit 142 may determine a voltage value of the cell voltage of each of the plurality of battery cells $BC_1$~$BC_n$ at a predetermined time interval based on the voltage signal from the voltage measurement circuit 110, and record the determined voltage value in the memory 141. The preset time may be equal to a time length of a period for abnormality detection as described below.

The control unit 142 determines an observation matrix X including a plurality of observation voltage vectors $X_1$~$X_n$ over the specified period Δt for the predetermined time in the past. A moving window 200 may be used to determine the observation matrix X. For example, the plurality of observation voltage vectors $X_1$~$X_n$ indicates a time-dependent change in the cell voltage of each of the plurality of battery cells $BC_1$~$BC_n$ measured at the preset time interval within the moving window 200. The moving window 200 is used to set the period Δt during which the plurality of observation voltage vectors $X_1$~$X_n$ is obtained with the movement of the moving window 200 by the preset time interval at the preset time interval. The size Δt of the moving window 200 may be preset or adjustable by the control unit 142.

The cell voltage of the battery cell BC may be measured by the voltage measurement circuit 110 multiple times (for example, a total of m, m is a natural number of 2 or greater) in time series, and the measured cell voltages may be recorded in the memory 141 by the control unit 142. For example, where the size of the moving window 200=200 sec and the preset time=1 sec, m=200, and thus the cell voltage of the battery cell BC is measured 200 times within the moving window 200.

Referring to FIG. 2, a curve 210 exemplarily indicates a time-dependent change in the cell voltage of the $k^{th}$ battery cell $BC_k$ among the plurality of battery cells $BC_1$~$BC_n$. The abnormal state may be a state that triggers an abnormal behavior of the cell voltage, for example, an internal short circuit. In FIG. 2, $t_1$ and $t_m$ are the starting time and the ending time of the specified period Δt, respectively, and $t_i$ is a time point corresponding to a time index i within the specified period Δt. In the $k^{th}$ battery cell $BC_k$, k is a natural number of n or smaller, and may indicate a cell index used to distinguish the plurality of battery cells $BC_1$~$BC_n$.

Hereinafter, the abnormality detection operation according to the present disclosure will be described on the basis of the $k^{th}$ battery cell $BC_k$. The description of the $k^{th}$ battery cell $BC_k$ may be applied in common to the remaining battery cells BC of the plurality of battery cells $BC_1$~$BC_n$.

Referring to FIG. 3, the observation matrix X is an m×n matrix including m rows and n columns. Hereinafter, for convenience of description, assume that m is a natural number that is larger than n, i is a natural number of 1 or greater and m or smaller, j is a natural number of 1 or greater and n or smaller, and k is a natural number of less than n.

The n column vectors of the observation matrix X may correspond to the plurality of observation voltage vectors $X_1$~$X_n$ in a one-to-one relationship. That is, each of the plurality of observation voltage vectors $X_1$~$X_n$ is a column vector of the observation matrix X, and includes m elements (the measured cell voltages). The $k^{th}$ observation voltage vector $X_k$ is a time-series array of the cell voltage of the $k^{th}$ battery cell $BC_k$ measured m times, i.e., a time-series (set) of the measured cell voltages $x_{1k}$~$x_{mk}$ of the $k^{th}$ battery cell $BC_k$. The $k^{th}$ observation voltage vector $X_k$ may be the $k^{th}$ column vector of the observation matrix X. Referring to FIG. 2, in the observation matrix X, '$x_{ik}$' is an element (referred to as 'data' or 'component') indicating the $i^{th}$ measured cell voltage among the cell voltages of the $k^{th}$ battery cell $BC_j$ measured a total of m times within the specific period Δt.

The control unit 142 may extract a first sub-matrix A, a second sub-matrix B and a third sub-matrix $C^T$ from the observation matrix X by applying matrix decomposition to the observation matrix X. That is, the observation matrix X may be decomposed into the first sub-matrix A, the second sub-matrix B and the third sub-matrix $C^T$. An algorithm used in the matrix decomposition may include, for example, Singular Value Decomposition (SVD) and Principal Component Analysis (PCA). In the specification, the superscript 'T' on the right side of the matrix indicates a transposed matrix. As shown, the product of multiplying the first sub-matrix A, the second sub-matrix B and the third sub-matrix $C^T$ is equal to the observation matrix X.

The first sub-matrix A is an m×m matrix. The second sub-matrix B is an m×n matrix. The third sub-matrix $C^T$ is an n×n matrix.

The first sub-matrix A is an orthogonal matrix, and includes a plurality of principal component vectors $A_1$~$A_m$. Each principal component vector of the plurality of principal component vectors $A_1$~$A_m$ may be referred to as a 'left singular vector'. Each principal component vector includes m elements, and may be a column vector of the first sub-matrix A. That is, the first sub-matrix A may be expressed below.

$$A = [A_1 \ \ A_2 \ \ \ldots \ \ A_m]$$

$$A_i = [a_{1i} \ \ a_{2i} \ \ \ldots \ \ a_{mi}]^T$$

Among the plurality of principal component vectors $A_1$~$A_m$, the principal component vectors $A_1$~$A_n$ indicate variance information of the observation matrix X. The $j^{th}$ principal component vector $A_j$ corresponds to an axial direction in which the variance of elements of the observation matrix X is the $j^{th}$ largest one. That is, when the elements of the observation matrix X are mapped to the axis of each of the plurality of principal component vectors $A_1$~$A_m$ once, the variance of the elements of the observation matrix X along the axis of the $j^{th}$ principal component vector $A_j$ may be the $j^{th}$ largest.

As the variance of the $j^{th}$ principal component vector $A_j$ is larger, it indicates that the $j^{th}$ principal component vector $A_j$ has a larger descriptive factor for a distribution of elements of the observation matrix X. As the descriptive factor of the $j^{th}$ principal component vector $A_j$ increases, the $j^{th}$ principal component vector $A_j$ contains a larger amount of information associated with the common voltage behavior characteristics (for example, a tendency of normal voltage behavior) of the plurality of battery cells $BC_1$~$BC_n$ within the moving window 200. On the contrary, as the variance of the $j^{th}$ principal component vector $A_j$ is smaller, the descriptive factor of the $j^{th}$ principal component vector $A_j$ is lower, i.e., the $j^{th}$ principal component vector $A_j$ contains a larger amount of information associated with noisy characteristics (for example, abnormal state).

The second sub-matrix B is a diagonal matrix, and includes a plurality of singular values $b_{11}$~$b_{nn}$ as elements of a principal diagonal. That is, the second sub-matrix B may be expressed below.

$$B = [B_1 \;\; B_2 \;\; \ldots \;\; B_n]$$

$$B_j = [b_{1j} \;\; b_{2j} \;\; \ldots \;\; b_{mj}]^T$$

Where i≠j, $b_{ij}$ is 0. $b_{jj}$ is the $j^{th}$ singular value.

That is, among the total of m×n elements of the second sub-matrix B, the remaining elements except n elements $b_{11}$~$b_{nn}$ of the principal diagonal are all 0. Accordingly, among the plurality of principal component vectors $A_1$~$A_m$, the principal component vectors $A_{n+1}$~$A_m$ may be redundant in the description of the variance information of the observation vector X.

The plurality of singular values $b_{11}$~$b_{nn}$ may satisfy the following relationship. $b_{11} \geq b_{22} \geq \ldots \geq b_{nn} \geq 0$. The plurality of singular values $b_{11}$~$b_{nn}$ may be referred to as first to $n^{th}$ singular values in the descending order of size, and $b_{jj}$ may be the $j^{th}$ largest singular value among the plurality of singular values $b_{11}$~$b_{nn}$.

The plurality of singular values $b_{11}$~$b_{nn}$ indicates descriptive factor information of the plurality of principal component vectors $A_1$~$A_n$. The singular value $b_{jj}$ of the second sub-matrix B indicates the descriptive factor of the $j^{th}$ principal component vector $A_j$.

The third sub-matrix $C^T$ is an orthogonal matrix and includes a plurality of coefficient vectors $C_1^T$~$C_n^T$. Each coefficient vector of the plurality of coefficient vectors $C_1^T$~$C_n^T$ may be referred to as a 'right singular vector'. Each coefficient vector includes n components, and may be a row vector of the third sub-matrix $C^T$. The third sub-matrix $C^T$ may be expressed below.

$$C^T = [C_1 \;\; C_2 \;\; \ldots \;\; C_n]^T = [C_1^T; \; C_2^T; \; \ldots ; \; C_n^T]$$

$$C_j^T = [c_{j1} \;\; c_{j2} \;\; \ldots \;\; c_{jn}]$$

The plurality of coefficient vectors $C_1^T$~$C_n^T$ indicates dependency information of the plurality of observation voltage vectors $X_1$~$X_n$ on the plurality of principal component vectors $A_1$~$A_n$. Specifically, how much each of the plurality of observation voltage vectors $X_1$~$X_n$ is affected by the $j^{th}$ principal component vector $A_j$ is set by the $j^{th}$ coefficient vector $C_j^T$. The $j^{th}$ coefficient vector $C_j^T$ includes a plurality of coefficients $c_{j1}$~$c_{jn}$ corresponding to the first to $n^{th}$ observation voltage vectors $X_1$~$X_n$ in a one-to-one relationship. For example, $c_{jk}$ of the $j^{th}$ coefficient vector $C_j^T$ indicates the influence of the $j^{th}$ principal component vector $A_j$ on the $k^{th}$ observation voltage vector $X_k$.

The first to $n^{th}$ principal component vectors $A_1$~$A_n$, the first to $n^{th}$ singular values $b_{11}$~$b_{nn}$ and the first to $n^{th}$ coefficient vectors $C_1^T$~$C_n^T$ may correspond to one another in a one-to-one relationship.

The observation matrix X is equal to the multiplication of the first sub-matrix A, the second sub-matrix B and the third sub-matrix $C^T$, and may satisfy the relationship by the following Equation 1.

$$X = [X_1 \;\; X_2 \;\; \ldots \;\; X_n] = \sum_{j=1}^{n} \left(b_{jj} \times A_j \times C_j^T\right) \qquad \text{< Equation 1 >}$$

In Equation 1, $A_j$ is treated as a (m×1) matrix, and $C_j^T$ is treated as a (1×n) matrix. Referring to Equation 1, the $k^{th}$ observation voltage vector $X_k$ is equal to the sum of first to $n^{th}$ partial voltage vectors that depend on the first to $n^{th}$ principal component vectors $A_1$~$A_n$ in a one-to-one relationship, and may satisfy the relationship by the following Equation 2.

$$X_k = \sum_{j=1}^{n} (b_{jj} \times A_j \times c_{jk}) = \sum_{j=1}^{n} Y_{kj} \qquad \text{< Equation 2 >}$$

In Equation 2, $Y_{kj}=(b_{jj} \times A_j \times c_{jk})$ is the $j^{th}$ partial voltage vector of the $k^{th}$ observation voltage vector X. The $j^{th}$ partial voltage vector $Y_{kj}$ of the $k^{th}$ observation voltage vector $X_k$ is a voltage component of the $k^{th}$ observation voltage vector $X_k$ that depends on the $j^{th}$ principal component vector $A_j$, and may be equal to the multiplication of the $j^{th}$ principal component vector $A_j$, the $j^{th}$ singular value $b_{jj}$ and the coefficient $c_{jk}$. That is, the $j^{th}$ partial voltage vector $Y_{kj}$ may be the result of recovering (approximating) the $k^{th}$ observation voltage vector $X_k$ using only the $j^{th}$ principal component vector $A_j$ among the first to $n^{th}$ principal component vectors $A_1$~$A_n$. Accordingly, the $j^{th}$ partial voltage vector $Y_{kj}$ has m elements corresponding to m elements of the $k^{th}$ observation voltage vector $X_k$ in a one-to-one relationship. The element of each partial voltage vector may be referred to as 'partial voltage (or approximation voltage)', and the partial voltage vector may be referred to as 'recovery voltage vector'.

The control unit 142 may calculate a ratio of a maximum singular value $b_{11}$ to a minimum singular value $b_{nn}$ among the first to $n^{th}$ singular values $b_{11}$~$b_{nn}$ prior to detecting abnormality of the first to $n^{th}$ battery cells $BC_1$~$BC_n$ based on the first to $n^{th}$ principal component vectors $A_1$~$A_n$, the first to $n^{th}$ singular values $b_{11}$~$b_{nn}$ and the first to $n^{th}$ coefficient vectors $C_1^T$~$C_n^T$. When the ratio of the maximum singular value $b_{11}$ to the minimum singular value $b_{nn}$ is less than a preset ratio (for example, 200%), the control unit 142 may output a fault message indicating disabled abnormality detection of the battery cell BC. The disabled abnormality detection is a situation in which there is no explicit difference in descriptive factor between the plurality of principal component vectors $A_1$~$A_n$. That is, in the disabled abnormality detection situation, none of the plurality of principal component vectors $A_1$~$A_n$ sufficiently includes information associated with the common voltage behavior characteristics of the plurality of battery cells $BC_1$~$BC_n$. The cause of the disabled abnormality detection may be, for example, malfunction of the voltage measurement circuit 110 or abnormality in the number of battery cells BC exceeding a predetermined ratio (for example, 50%) among the first to $n^{th}$ battery cells $BC_1$~$BC_n$.

When the ratio of the maximum value $b_{11}$ to the minimum value $b_{nn}$ is less than the preset ratio, the control unit 142 may increase the size of the moving window 200 by a predetermined time in the next cycle. The reason of increasing the size of the moving window 200 is to sufficiently reflect the common voltage behavior characteristics of the plurality of battery cells $BC_1$~$BC_n$ in the observation vectors X.

Figure 4:
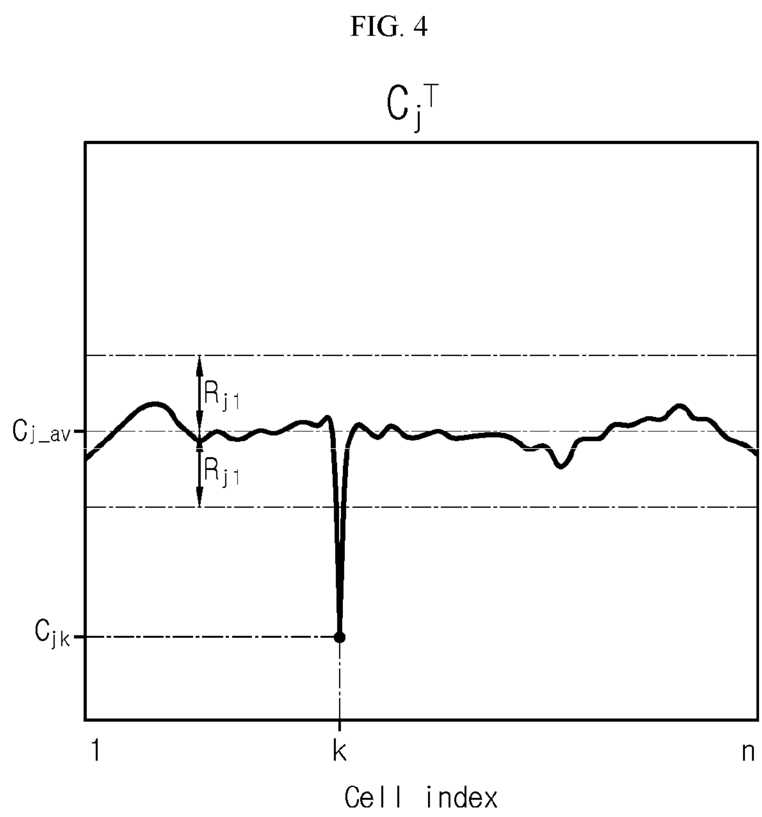
FIG. 4 is a graph exemplarily showing a coefficient vector.

FIG. 4 is a graph exemplarily showing the coefficient vector. In FIG. 4, the horizontal axis indicates the cell index corresponding to each coefficient of the $j^{th}$ coefficient vector $C_j^T$, and the vertical axis indicates the size of each coefficient. For example, the cell index=1 corresponds to the first battery cell $BC_1$.

The control unit 142 determines whether there is an invalid coefficient in first to $n^{th}$ coefficients $c_{j1}$~$c_{jn}$ included in the $j^{th}$ coefficient vector $C_j^T$ by comparing the first to $n^{th}$ coefficients $c_{j1}$~$c_{jn}$. The invalid coefficient of the $j^{th}$ coefficient vector $C_j^T$ indicates the degree of abnormal voltage behavior by the $j^{th}$ principal component vector $A_j$ reflected in the voltage history of the specific battery cell corresponding to the corresponding invalid coefficient. The remaining coefficients except the invalid coefficient may be a valid coefficient.

Referring to FIG. 4, the control unit 142 may determine an average $c_{j\_av}$ and a standard deviation of the first to $n^{th}$ coefficients $c_{j1}$~$c_{jn}$ included in the $j^{th}$ coefficient vector $C_j^T$. The control unit 142 may determine a first reference value $R_{j1}$ based on the standard deviation of the first to $n^{th}$ coefficients $c_{j1}$~$c_{jn}$. For example, the control unit 142 may determine the first reference value $R_{j1}$ to be equal to the multiplication of the standard deviation and a first scaling factor. The first scaling factor may be pre-recorded in the memory 141.

The control unit 142 may determine each coefficient having an absolute value of difference between the coefficient and the average $c_{j\_av}$ larger than the first reference value $R_{j1}$ among the first to $n^{th}$ coefficients $c_{j1}$~$c_{jn}$ as the invalid coefficient of the $j^{th}$ coefficient vector $C_j^T$. FIG. 4 shows that the coefficient $c_{jk}$ is smaller than the average $c_{j\_av}$ by more than the first reference value $R_{j1}$. Accordingly, the control unit 142 may determine the coefficient $c_{jk}$ as the invalid coefficient of the $j^{th}$ coefficient vector $C_j^T$.

Figure 5:
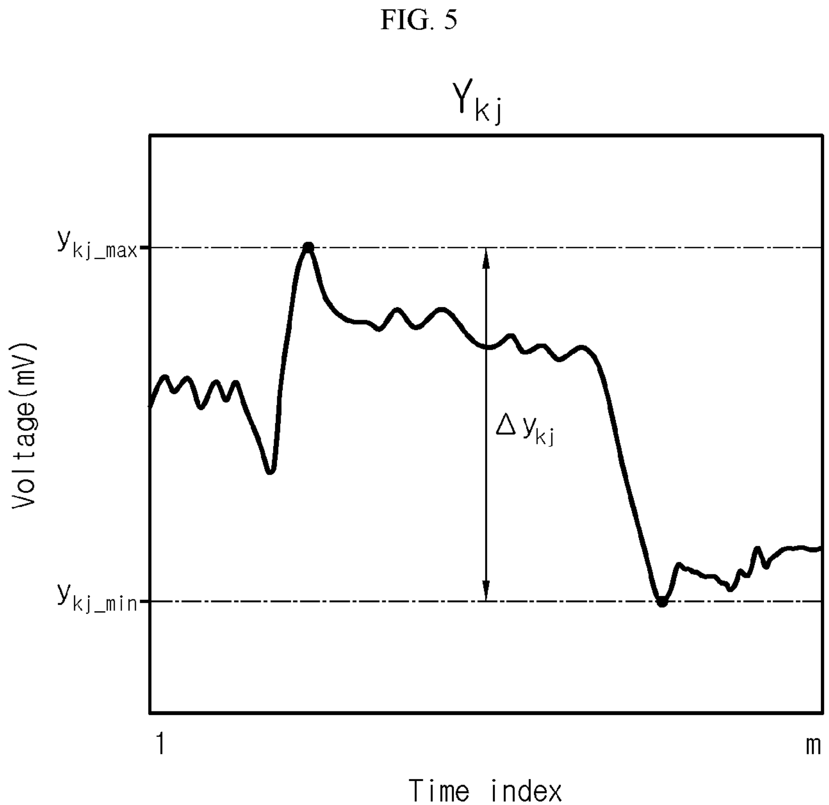
FIG. 5 is a diagram referenced in describing a relationship between an invalid coefficient and a partial voltage vector.

FIG. 5 is a diagram reference in describing the relationship between the invalid coefficient and the partial voltage vector. FIG. 5 is a graph exemplarily showing the $j^{th}$ partial voltage vector $Y_{kj}$ of the $k^{th}$ observation voltage vector $X_k$ corresponding to the invalid coefficient $c_{jk}$ of FIG. 4. In the same way as the $k^{th}$ observation voltage vector $X_k$, the $j^{th}$ partial voltage vector $Y_{kj}$ is an (m×1) matrix. In FIG. 5, the horizontal axis indicates the time index within the moving window 200, and the vertical axis indicates the partial voltage.

Referring to FIG. 5, the control unit 142 may determine a voltage characteristic value of the partial voltage vector $Y_{kj}$ based on m partial voltages included in the partial voltage vector $Y_{kj}$. The voltage characteristic value may be a parameter indicating the influence (occupancy rate) of the partial voltage vector $Y_{kj}$ on the $k^{th}$ observation voltage Within the moving window 200, a large rate and/or slope of the voltage vector $X_k$. change exhibited by the partial voltage vector $Y_{kj}$ may indicate that the abnormal voltage behavior associated with the invalid coefficient $c_{jk}$ is greatly reflected in the $k^{th}$ observation voltage vector $X_k$. For example, the control unit 142 may determine the voltage characteristic value to be equal to a difference $\Delta y_{kj}$ between the maximum partial voltage $y_{kj\_max}$ and the minimum partial voltage $y_{kj\_min}$ among the m partial voltages of the partial voltage vector $Y_{kj}$. Alternatively, the control unit 142 may determine the voltage characteristic value to be equal to a slope between the maximum partial voltage $y_{kj\_max}$ and the minimum partial voltage $y_{kj\_min}$.

When the voltage characteristic value of the partial voltage vector $Y_{kj}$ is larger than a second reference value, the control unit 142 may detect the $k^{th}$ battery cell $BC_k$ corresponding to the invalid coefficient $c_{jk}$ as faulty. The control unit 142 may determine the second reference value based on the voltage resolution of the voltage measurement circuit 110. For example, the control unit 142 may determine the second reference value to be equal to multiplication of the voltage resolution and a second scaling factor. The second scaling factor may be pre-recorded in the memory. Alternatively, the second reference value may be preset to, for example, 10.0 mV, considering the voltage resolution. The second reference value is for preventing the likelihood that a normal battery cell is wrongly detected as a faulty battery cell due to a measurement error of the cell voltage measured by the voltage measurement circuit 110. When the voltage characteristic value $\Delta y_{kj}$ is larger than the second reference value, the $k^{th}$ battery cell $BC_k$ may be determined to be faulty.

FIG. 6 is a flowchart exemplarily showing a battery diagnosis method according to a first embodiment of the present disclosure. The method of FIG. 6 may be repeated at a preset time interval.

Referring to FIGS. 1 to 6, in step S610, the control unit 142 determines an observation matrix X including ae plurality of observation voltage vectors $X_1$~$X_n$ corresponding to a plurality of battery cells $BC_1$~$BC_n$ in a one-to-one relationship. The plurality of observation voltage vectors $X_1$~$X_n$ indicates a time series of cell voltage of each of the plurality of battery cells $BC_1$~$BC_n$ measured multiple times m in time series within the moving window 200.

In step S620, the control unit 142 determines a plurality of principal component vectors $A_1$~$A_n$, a plurality of singular values $b_{11}$~$b_{nn}$ and a plurality of coefficient vectors $C_1^T$~$C_n^T$ from the observation matrix X (see Equation 1).

Steps S630 to S670 may be performed once for at least one of the plurality of coefficient vectors $C_1^T$~$C_n^T$. For example, the steps S630 to S670 may be performed on a predetermined number of coefficient vectors corresponding to a predetermined number of singular values among the plurality of singular values $b_{11}$~$b_{nn}$ in an ascending order. In another example, the steps S630 to S670 may be performed on the coefficient vector corresponding to each singular value of which a ratio to the sum of the plurality of singular values $b_1$~$b_{nn}$ is equal to or less than a predetermined value.

In the step S630, the control unit 142 determines a first reference value $R_{j1}$ by comparing a plurality of coefficients $c_{j1}$~$c_{jn}$ of the coefficient vector $C_j^T$. Alternatively, the first reference value $R_{j1}$ may be a preset constant, and in this case, the step S630 may be omitted.

In step S640, the control unit 142 determines whether at least one of the plurality of coefficients $c_{j1}$~$c_{jn}$ is larger than the first reference value $R_{j1}$. When a value of the step S640 is "No", the method may end. When the value of the step S640 is "Yes", the method performs step S650.

In step S650, the control unit 142 determines the coefficient $c_{jk}$ larger than the first reference value $R_{j1}$ among the plurality of coefficients $c_{j1}$~$c_{jn}$ as an invalid coefficient of the coefficient vector $C_jT$.

In step S660, the control unit 142 extracts a partial voltage vector $Y_{kj}$ of the observation voltage vector $X_k$ corresponding to the invalid coefficient $c_{jk}$ based on the principal component vector $A_j$, the singular value $b_{jj}$ and the invalid coefficient $c_{jk}$ (see Equation 2).

In step S670, the control unit 142 determines a voltage characteristic value $\Delta y_{kj}$ of the partial voltage vector $Y_{kj}$.

In step S680, the control unit 142 determines whether the voltage characteristic value $\Delta y_{kj}$ is larger than a second reference value. When a value of the step S680 is "No", the method may end. The value of the step S680 being "Yes" indicates that the battery cell $BC_k$ corresponding to the invalid coefficient $c_{jk}$ is detected as faulty. When the value of the step S680 is "Yes", the method performs step S690.

In step S690, the control unit 142 activates a predetermined protection operation. For example, the control unit 142 turns off the switch 20. In another example, the control unit 142 outputs a diagnosis message indicating information (for example, the cell index) of the battery cell $BC_k$ detected as faulty. The diagnosis message may be transmitted and received between the battery controller 140 and the remote controller 240 through the interface unit 150. The interface unit 150 may output visual and/or audible information corresponding to the diagnosis message.

Figure 7:
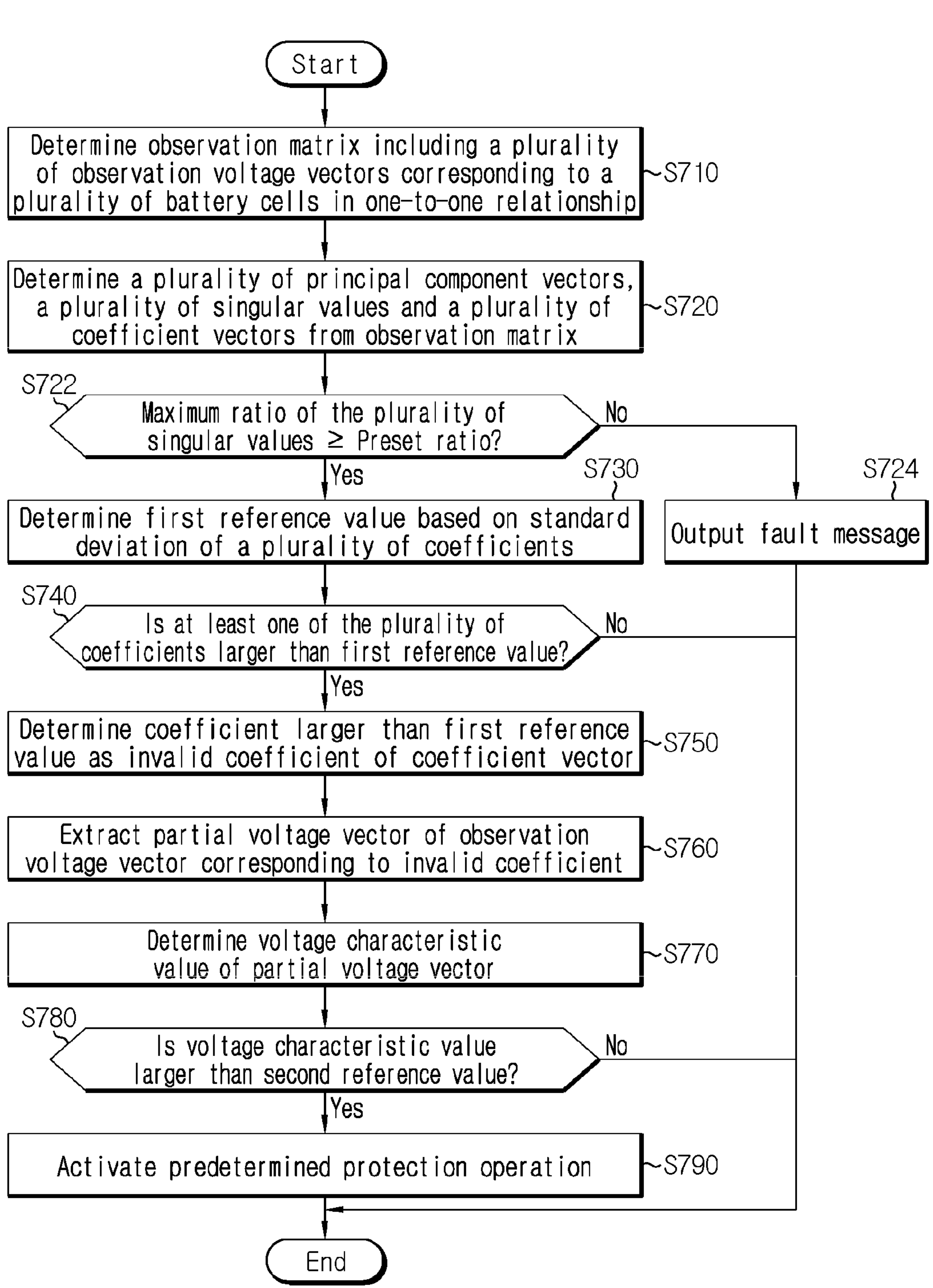
FIG. 7 is a flowchart exemplarily showing a battery diagnosis method according to a second embodiment of the present disclosure.

FIG. 7 is a flowchart exemplarily showing a battery diagnosis method according to a second embodiment of the present disclosure. The method of FIG. 7 may be repeated at a preset time interval.

In the method of FIG. 7, steps S710 to S790 are the same as the steps S610 to S690 of FIG. 6, and the repeated description is omitted.

The method of FIG. 7 further including steps S722 and S724 is different from the method of FIG. 6.

In step S722, the control unit 142 determines whether a maximum ratio of the plurality of singular values $b_{11}$~$b_{nn}$ is equal to or larger than a preset ratio. The maximum ratio is a ratio of a maximum value $b_{11}$ to a minimum value $b_{nn}$ among the plurality of singular values $b_{11}$~$b_{nn}$. A value of the step S722 being "No" indicates that there is no principal component vector having sufficiently large descriptive factor than the remaining principal component vectors among the plurality of principal component vectors $A_1$~$A_n$. When the value of the step S722 is "No", the method performs step S724. When the value of the step S722 is "Yes", the method performs the step S730.

In step S724, the control unit 142 outputs a fault message. The fault message indicates disabled abnormality detection. The fault message may be transmitted and received between the battery controller 140 and the remote controller 240 through the interface unit 150. The interface unit 150 may output visual and/or audible information corresponding to the fault message.

Although the description made above with reference to FIGS. 2 to 7 is made under the assumption that the battery controller 140 is provided as the battery diagnosis device, instead of the battery controller 140, the remote controller 240 may act as the battery diagnosis device. That is, the description of each of the control unit 142 and the memory 141 may be in common to the control unit 242 and the memory 241. When the remote controller 240 is provided as the battery diagnosis device, the battery management system 100 may transmit data indicating the plurality of observation voltage vectors $X_1$~$X_n$ the communication circuit 243 of the remote controller 240 through the interface unit 150.

The embodiments of the present disclosure described hereinabove are not implemented only through the apparatus and method, and may be implemented through programs that perform functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings. and some or all of the embodiments may be selectively combined to allow various modifications.

The invention claimed is:

1. A battery diagnosis device, comprising:

a memory configured to store an observation matrix including a plurality of observation voltage vectors indicating a time-series of a cell voltage of each of a plurality of battery cells; and a controller configured to:

determine a plurality of principal component vectors, a plurality of singular values and a plurality of coefficient vectors from the observation matrix, wherein each coefficient vector includes a plurality of coefficients corresponding to the plurality of observation voltage vectors in a one-to-one relationship, and for each coefficient vector:

determine an invalid coefficient among the plurality of coefficients by comparing the plurality of coefficients included in the corresponding coefficient vector, and detect abnormality of a battery cell corresponding to the invalid coefficient among the plurality of battery cells by following a diagnosis procedure in sequence of:

determining a principal component vector corresponding to the corresponding coefficient vector among the plurality of principal component vectors, determining a singular value corresponding to the corresponding coefficient vector among the plurality of singular values, and determining the invalid coefficient; and detect the battery cell corresponding to the invalid coefficient among the plurality of battery cells as faulty when a voltage characteristic value of the partial voltage vector is larger than a second reference value, wherein the controller is further configured to activate a predetermined protection operation when the battery cell is detected as faulty, and wherein the predetermined protection operation includes turning off a switch.

2. The battery diagnosis device according to claim 1, wherein the controller is further configured to determine a first sub-matrix, a second sub-matrix and a third sub-matrix by applying a matrix decomposition algorithm to the observation matrix, the first sub-matrix includes the plurality of principal component vectors as column vectors, the second sub-matrix includes the plurality of singular values as elements of a principal diagonal, and the third sub-matrix includes the plurality of coefficient vectors as row vectors.

3. The battery diagnosis device according to claim 1, wherein the controller is further configured to determine, as the invalid coefficient, a coefficient of which an absolute value of a difference between the coefficient and an average of the plurality of coefficients among the plurality of coefficients is larger than a first reference value.

4. The battery diagnosis device according to claim 3, wherein the controller is further configured to determine the first reference value by multiplying a standard deviation of the plurality of coefficients by a first scaling factor.

5. The battery diagnosis device according to claim 1, wherein the controller is further configured to, for each coefficient vector:

extract a partial voltage vector of an observation voltage vector corresponding to the invalid coefficient among the plurality of observation voltage vectors by multiplying the principal component vector corresponding to the corresponding coefficient vector among the plurality of principal component vectors, the singular value corresponding to the corresponding coefficient vector among the plurality of singular values and the invalid coefficient.

6. The battery diagnosis device according to claim 5, wherein the controller is further configured to determine the voltage characteristic value to be equal to a difference between a maximum partial voltage and a minimum partial voltage among a plurality of partial voltages included in the partial voltage vector.

7. The battery diagnosis device according to claim 5, wherein the controller is further configured to determine the second reference value to be equal to a value obtained by multiplying a voltage resolution of a voltage measurement circuit by a second scaling factor.

8. The battery diagnosis device according to claim 1, wherein the controller is further configured to output a fault message when a ratio of a maximum singular value to a minimum singular value among the plurality of singular values is less than a preset value.

9. A battery pack comprising the battery diagnosis device according to claim 1.

10. A battery system comprising the battery pack according to claim 9.

11. The battery diagnosis device according to claim 1, wherein the abnormality of the battery cell is detected based on only the cell voltage from among a current, a temperature and the cell voltage of the battery cell.

12. A battery diagnosis method, comprising:

determining a plurality of principal component vectors, a plurality of singular values and a plurality of coefficient vectors from an observation matrix including a plurality of observation voltage vectors indicating a time series of a cell voltage of each of a plurality of battery cells, wherein each coefficient vector includes a plurality of coefficients corresponding to the plurality of observation voltage vectors in a one-to-one relationship;

for each coefficient vector:

determining an invalid coefficient among the plurality of coefficients by comparing the plurality of coefficients included in the corresponding coefficient vector;

detecting abnormality of a battery cell corresponding to the invalid coefficient among the plurality of battery cells by following a diagnosis procedure in sequence of:

determining a principal component vector corresponding to the corresponding coefficient vector among the plurality of principal component vectors, determining a singular value corresponding to the corresponding coefficient vector among the plurality of singular values, and determining the invalid coefficient;

detecting the battery cell corresponding to the invalid coefficient among the plurality of battery cells as faulty when a voltage characteristic value of the partial voltage vector is larger than a second reference value; and activating a predetermined protection operation when the battery cell is detected as faulty, wherein the predetermined protection operation includes turning off a switch.

13. The battery diagnosis method according to claim 12, wherein the determining the invalid coefficient among the plurality of coefficients comprises determining, as the invalid coefficient, a coefficient of which an absolute value of a difference between the coefficient and an average of the plurality of coefficients among the plurality of coefficients is larger than a first reference value.

14. The battery diagnosis method according to claim 12, wherein the detecting the abnormality of the battery cell corresponding to the invalid coefficient among the plurality of battery cells comprises:

extracting a partial voltage vector of an observation voltage vector corresponding to the invalid coefficient among the plurality of observation voltage vectors by multiplying the principal component vector corresponding to the corresponding coefficient vector among the plurality of principal component vectors, the singular value corresponding to the corresponding coefficient vector among the plurality of singular values and the invalid coefficient.

15. The battery diagnosis device according to claim 1, wherein the controller detects the abnormality of the battery cell based on only the cell voltage of the battery cell among the plurality of battery cells of the observation matrix.

16. The battery diagnosis device according to claim 1, wherein the time-series of the cell voltage is obtained over a specified period of a time window that moves by a preset or adjustable time interval.

17. The battery diagnosis device according to claim 1, wherein the predetermined protection operation further includes outputting a diagnosis message.

18. The battery diagnosis method according to claim 12, wherein the detecting the abnormality of the battery cell is based on only the cell voltage of the battery cell among the plurality of battery cells of the observation matrix.

19. The battery diagnosis method according to claim 12, wherein a time-series of the cell voltage is obtained over a specified period of a time window that moves by a preset or adjustable time interval.

20. The battery diagnosis method according to claim 12, wherein the abnormality of the battery cell is detected based on only the cell voltage from among a current, a temperature and the cell voltage of the battery cell.

* * * * *